United States Patent
Yamada et al.

(10) Patent No.: US 6,512,184 B1
(45) Date of Patent: Jan. 28, 2003

(54) ANISOTROPICALLY ELECTROCONDUCTIVE CONNECTION BODY AND METHOD FOR FORMING IT

(75) Inventors: Yukio Yamada, Kanuma (JP); Hiroyuki Fujihira, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 4 days.

(21) Appl. No.: 09/659,449

(22) Filed: Sep. 11, 2000

(30) Foreign Application Priority Data

Sep. 14, 1999 (JP) ............................................. 11-261094

(51) Int. Cl.[7] ................................................ H05K 1/02
(52) U.S. Cl. ....................................... 174/259; 174/260
(58) Field of Search ................................. 174/259, 260; 361/751; 29/833

(56) References Cited

U.S. PATENT DOCUMENTS 5,019,944 A * 5/1991 Ishii et al. .................. 361/400
6,058,021 A * 5/2000 Yamamoto .................. 361/783
6,172,878 B1 * 1/2001 Takabayashi et al. ........ 361/760
6,223,429 B1 * 2/2001 Kaneda et al. ................. 29/832

* cited by examiner

Primary Examiner—Kainand Cuneo
Assistant Examiner—Jeremy Norris
(74) Attorney, Agent, or Firm—Flynn, Thiel, Boutell & Tanis, P.C.

(57) ABSTRACT

An anisotropically electroconductive connection body, in which two elements, each having electrodes on a confronting face, are connected with each other. The connection body is made up of a connecting material containing an adhesive component constituted mainly of a thermosetting resin, the connecting material being interposed between the two elements to be connected, and an extraneous portion of the connecting material protruding from the periphery of one of the elements on the other one of the elements, wherein the degree of hardening of the thermosetting resin in the connecting material in the extraneous portion is at least 60%.

13 Claims, 3 Drawing Sheets

ANISOTROPICALLY ELECTROCONDUCTIVE CONNECTION BODY AND METHOD FOR FORMING IT

FIELD OF THE INVENTION

The present invention relates to an anisotropically electroconductive connection body, in which two elements, each having electrodes on a confronting face, are connected with each other, as well as to a method for forming such a connection body by interposing between the elements a connecting material containing a binder component comprising a thermosetting resin.

DESCRIPTION OF THE RELATED TECHNIQUES

A connecting material constituted predominantly of a thermosetting resin has been used for establishing electrical connection between opposing electrodes disposed on two elements to be bonded with each other. For example, in a liquid crystal display (LCD), such a connection is realized between an indium tin oxide film (ITO film) on a substrate glass plate and an IC chip of a driver IC or a tape carrier package (TCP). Also in the assemblage of semiconductors, such as IC and LSI, on a substrate circuit board, it has been practiced to build up electrical connection between bear chips of the semiconductors and the circuit board directly using a connecting material. The connection between the circuit board and these elements to be connected is performed by holding them in a posture in which the electrodes or terminals disposed on the chips and on the circuit board are in a correspondingly confronting relationship with each other, while interposing the connecting material between these elements, whereupon the material is caused to harden to attain mechanical firm fixation and electrical connection therebetween simultaneously.

In such a connecting material, a thermosetting resin is used as the main component. The connecting material is interposed between the elements to be connected, for example, IC chips and substrate circuit boards, and these elements are held in such a posture that the electrodes or terminals to be electrically connected together disposed on them are in a correspondingly confronting relationship, whereupon the elements are heat-pressed onto each other by pressing them together with heating to cause the thermosetting resin to set to thereby build up the connection body. Here, the mechanical bonding between the elements is secured by the adhesive strength of the resin and the electrical connection between the corresponding electrodes or terminals is attained by a pressed friction contact of them secured by the heat setting of the resin. This electrical connection by frictional press contact between the elements may be attained by direct contact of the electrodes or the terminals with each other or under intermediation with electroconductive particles contained in the connecting material in a dispersed state.

The connection body formed in this manner is held in an electrically conductive condition with respect to the connected electrodes or terminals by direct or intermediate electroconductive contact of them, while the connection body is held in an insulated condition between the adjacent connected electrodes or terminals with each other, by isolation of them and due to isolation of each electroconductive particle by the electroinsulating resin mass surrounding them. Thus, the resulting assembly serves as an anisotropically electroconductive connection body.

The elements to be connected are put together and the connecting material is interposed therebetween in such a manner that a part of the material is caused to protrude from the periphery of one of the elements on the other element to form an extraneous portion of the material on the other element in order to contribute to the positioning of the elements and in order to exclude the occurrence of defects in the connection between the elements.

The connection body having such a protruded portion obtained in this manner was found, however, to be still subject to the occurrence of defective electric continuity. Examination of the reason for this problem had led to the discovery that the connecting material in the protruded portion mentioned above is not subjected to heat setting sufficiently and is in a state in which hardened resin and uncured mass are present therein in a mixed form. In general, the heat-set resin contained in the connection body may often be contaminated by impurities. For example, an epoxy resin commonly used as a thermosetting resin often contains impurities, including chloride ions originating from its raw material, epichlorohydrin. In some cases, impurities, such as chloride ions, sodium ions, etc., may also be introduced from the elements to be bonded together or from contamination through the processing steps.

These impurities will not usually cause any hazard of galvanic corrosion at the heat-pressed contact portion, since the impurities are confined within the heat-set resin in the heat-pressed portion of the connection material. The uncured resin mass has, however, a high hygroscopic ability and may have a considerable moisture content, causing the ionic impurities to become associated with the contained water, resulting in an increase in the electroconductivity of the resin mass. Since the electrodes and terminals of the elements to be bonded are laid passing through the above-mentioned protruding extraneous part of the bonding mass, therefore, the electrodes and terminals are brought into contact with the higher water content region. When the assemblage containing these elements is actuated by impressing a voltage, aluminum constituting the material of the electrode and terminal, ITO and so on may be subjected to a galvanic corrosion, resulting eventually in the occurrence of a defective electroconductivity in the above-mentioned extraneous portion of the resin mass.

SUMMARY OF THE INVENTION

The object of the present invention is to provide an anisotropically electroconductive connection body formed between two elements to be connected together, each provided on a confronting face with a plurality of electrodes, which can avoid the occurrence of defective electroconductivity under prevention of galvanic corrosion of the electrodes and terminals inside the connecting material, as well as to provide a method for attaining such a connection body by interposing between the elements to be connected together a connecting material containing an adhesive component comprising a thermosetting resin.

The above object of the present invention is attained according to the present invention. Thus, the present invention consists of an anisotropically electroconductive connection body and a method for forming such a connection body, as given below:

(1) An anisotropically electroconductive connection body, in which two elements, each having electrodes on a confronting face, are connected with each other, comprising
    a connecting material containing an adhesive component comprising a thermosetting resin, which is interposed between the two elements to be connected, and an extraneous portion of the connecting material protruding from the periphery of one of the elements on the other one of the elements, wherein the degree of hardening of the thermosetting resin in the connecting material in the extraneous portion is at least 60%.

(2) The connection body as defined in the above (1), wherein the saturation limit of moisture absorption of the connecting material in the extraneous portion at 85° C. and at a relative humidity of 85% is 3% or less.

(3) A method for forming an anisotropically electroconductive connection body, in which two elements, each having electrodes on confronting faces, are connected with each other, comprising interposing between the elements to be connected with each other a connecting material containing an adhesive component comprising a thermosetting resin so as to form an extraneous portion of the connecting material protruding from the periphery of one of the elements on the other one of the elements, while holding these elements in a posture in which the electrodes on the confronting face of each of the elements are in a correspondingly confronting relationship with each other, heat-pressing the two elements onto each other to harden the thermosetting resin and heating the extraneous portion of the connecting material simultaneously with or after the heat-pressing to effect hardening of the thermosetting resin of this portion up to a degree of hardening of at least 60%.

(4) The method as defined in the above (3), wherein the heating of the extraneous portion is effected by blowing a hot gas onto the extraneous portion.

(5) The method as defined in the above (3), wherein the heating of the extraneous portion is effected by heating the other one of the elements.

(6) The method as defined in the above (3), wherein the hardening of the thermosetting resin in the extraneous portion of the connecting material is effected by heating the connection body totally after the heat-pressing.

DETAILED DESCRIPTION OF THE DISCLOSURE

Figure 1:
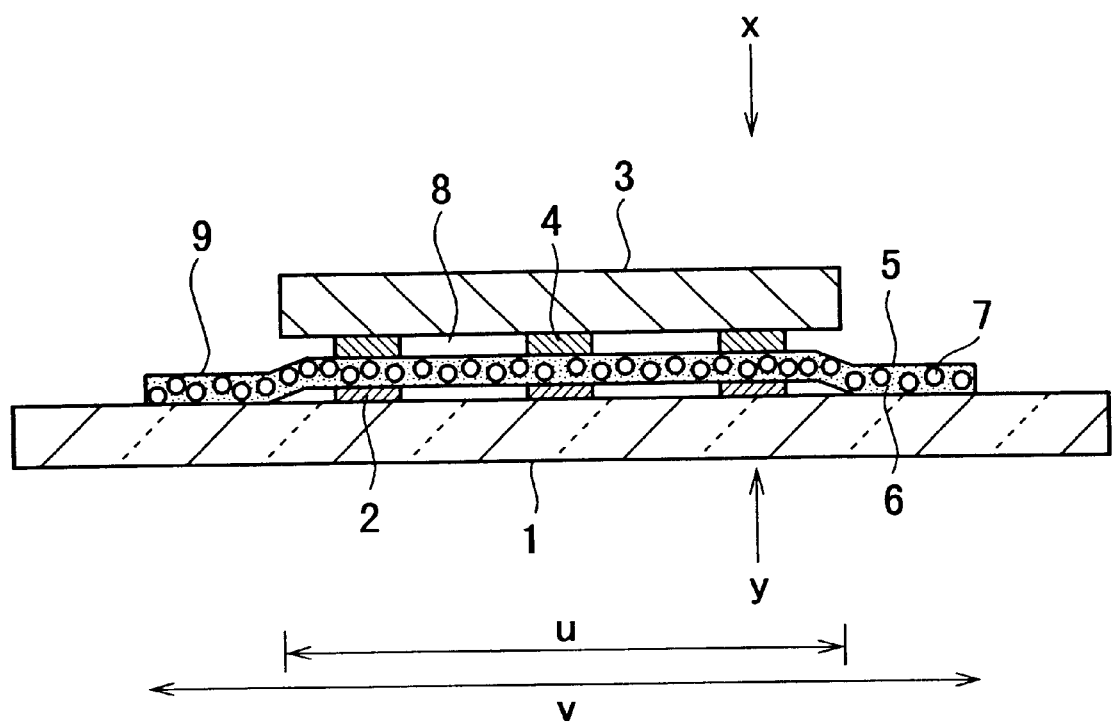
FIG. 1(a) shows the sectional view of an embodiment of the connection body according to the present invention before the heat-pressing in a schematic illustration.
FIG. 1(b) shows the sectional view of the embodiment of FIG. 1(a) after the heat-pressing.
Figure 1:
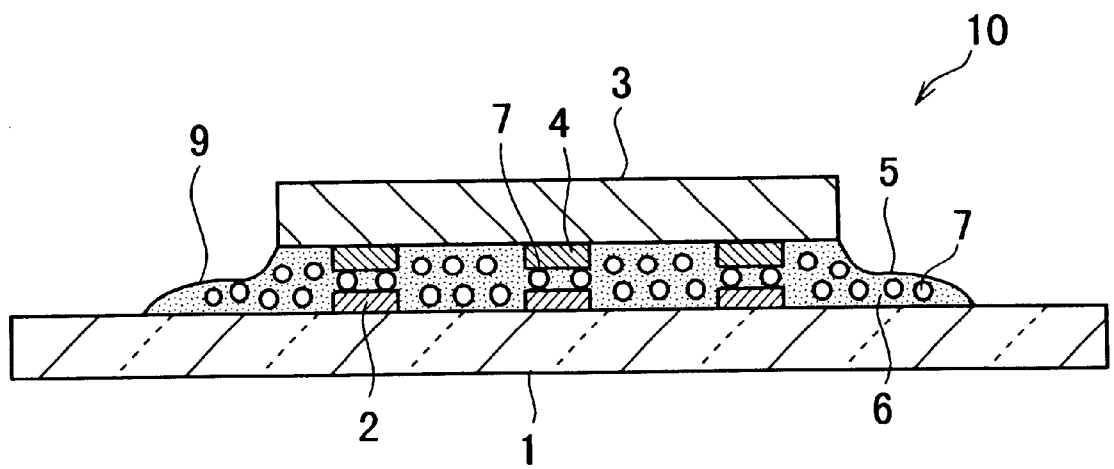

For the elements to be connected in the connection body according to the present invention, every element pair having electrodes, in particular, a large number of electrodes to be connected electroconductively with those disposed on the other element may serve as the object of the junction. The present invention may particularly be applicable to those in which each of two elements to be connected together has electrodes arranged within a narrow region with a closer pitch, in a small width and at a narrow interval, as in the case of assembling a driver IC and a TCP on a glass substrate board in an LCD and in the case of the installation of semiconductor chips, such as bear chips, on a circuit board of general use. In many cases, a substrate board is used as the counter element for the above-mentioned IC chip or semiconductor chip to be bonded. The connecting material according to the present invention can be used also for assembling semiconductor chips and the like on the substrate board directly or under intermediation with, for example, an interposer. Here, substrate boards made of any voluntary material may be used, for example, glass/epoxy substrate boards, resin boards, glass boards and flexible resin boards.

The connecting material contains an adhesive component comprising a thermosetting resin. The connecting material is interposed between the elements to be connected together and the elements are pressed onto each other from both sides so as to cause the electrodes disposed opposingly on the confronting face of each element to be brought onto contact with each other, while holding the interval between neighboring electrodes filled with the connecting material. In this state, the connecting material is caused to harden in order to attain electrical connection and mechanical fixation simultaneously. The electrical connection between the opposing electrodes may be realized either by a direct contact of the electrodes or under intermediation with electroconductive particles. If the surface area of the rising portion of the electrode, such as a stud bump, is small (for example, 200 $\mu m^2$ or less), direct contact may be permitted, while contact under intermediation with electroconductive particles is favorable for electrodes with greater surface areas. The electroconductive particles are admixed with the connecting material to be dispersed therein.

As the main resin of the thermosetting resin to be incorporated in the connecting material, any kind of resin capable of being cured by a concurrent use of a hardening agent under the action of heat or irradiation of rays, such as UV rays, etc., may be used, for example, epoxy resins, urethane resins, phenol resins, hydroxyl group-containing polyester resins, hydroxyl group-containing acryl resins and so on. Epoxy resins are the most preferable in view of the balance between the participant parameters, such as hardening temperature, hardening time, storage stability and so on of the resin. As the epoxy resins, those of the bisphenol type, those of the epoxy-novolak type and those obtained from epoxy compounds having two or more oxirane groups in the molecule may be used. Commercial products of these epoxy resins may also be employed as such.

While the main resin of the thermosetting resin of the connecting material can be subjected to hardening, usually by concurrent use of a hardening agent, it is permissible to dispense with the use of a hardening agent, when a substituent functional group facilitating the hardening reaction is present in the molecule of the main resin. As the hardening agent, there may be used those which can be subjected to a hardening reaction with the main resin under the influence of heat or irradiation of a ray, for example, imidazoles, amines, acid anhydrides, hydrazides, dicyandiamides, isocyanates and modified products of them. Commercial products may also be employed. For such a hardening agent, preference is given to a latent hardening agent.

A latent hardening agent will not cause a curing reaction during processing operations and storage at normal temperatures and upon drying at a relatively lower temperature (40–100° C.) but will be subjected to a curing reaction under pressure with heating (heat-pressing) at a curing temperature or by the action of heat or irradiation of a ray, such as a UV ray. For such a latent hardening agent, particular preference is given to one in which the above-mentioned hardening agent, such as an imidazole or an amine, is encapsulated in microcapsules, for which commercial products may also be employed. For activation by heating, those having a curing initiation temperature of 80–150° C. may be preferred.

The adhesive component of the connecting material may include a thermoplastic resin in order to impart to the connecting material an ability of being coated on substrates or of film-forming. For such a thermoplastic resin, there may be used, for example, a phenoxy resin, polyester resin, acrylic resin, polyurethane resin, butyral resin, NBR or SBR.

The adhesive component of the connecting material according to the present invention may further contain other additives, such as a coupling agent, antioxidant, surfactant and so on.

The connecting material may or may not contain electro-conductive particles. Thus, it may contain particles of a metal, such as a solder metal, nickel metal or so on; conductor-coated particles in which nucleus resin particles are coated with an electro-conductive material; and insulator-coated particles in which these electroconductive particles are coated with an insulating resin. The average particle size of these electroconductive particles may be in the range of 1 to 10 $\mu$m, preferably in the range of 2 to 8 $\mu$m.

While the adhesive component may be constituted of only the thermosetting resin, it may contain a thermoplastic resin in an amount of up to 40% by weight, preferably in the range of 1 to 30% by weight, and other additive(s) in an amount of up to 10% by weight, preferably in the range of 1 to 5% by weight. The electroconductive particles may be contained in the connecting material in an amount of 0 to 40% by volume, preferably 1 to 30% by volume, based on the total sum volume of the above-mentioned constituent ingredients of the adhesive component.

In the constituent ingredients, above all, the thermosetting resin, contaminant ions may be occluded. For example, an epoxy resin contains contaminant chloride ions. While there is no limitation in the contaminant ion content of the connecting material according to the present invention, it is preferable that the contaminant ion content thereof is 100 ppm or less, as the content before hardening. The contaminant ion content can be detected by ion chromatography.

The connecting material according to the present invention may be present in a form of a paste or a film.

For preparing a paste of the connecting material, the constituent ingredients are dissolved or dispersed in a suitable solvent to form a paste.

For preparing the connecting material in a form of a film, the above paste of the connecting material is coated on an exfoliative sheet in a layer, whereupon the solvent of the paste is volatilized to build up a film.

The connecting material according to the present invention is interposed between two elements to be connected together, such as a substrate circuit board and a semiconductor chip, each provided on a confronting face with a plurality of electrodes or terminals, while holding these elements in a posture in which the electrodes or terminals on the confronting face of each of the elements are in a correspondingly confronting relationship to each other, whereupon the elements are heat-pressed by pressing them together from both sides with heating to cause the thermosetting resin to cure and form a solid connection body. Here, the connecting material is interposed between the elements so as to form an extraneous portion of the connecting material protruding from the periphery of one of the elements on the other one of the elements. In the case of using a paste of the connecting material, it is coated on one of the elements over an area somewhat greater than the bonding extent of the other one of the elements including the electrodes or terminals in order to provide for the extraneous portion of the connecting material, whereupon the other one of the elements is placed on the so-coated face of the one of the elements before or after drying the coated layer in such a position that the corresponding confronting electrodes or terminals are in proper opposition to each other, followed by heat pressing of the assemblage to obtain a cured solid connection body. In the case of using a film of the connecting material, it is interposed between the two elements to be connected together, followed by heat pressing of the assemblage to obtain a cured solid connection body. The curing may be realized not only by heating but also by the action of irradiation of a ray, such as a UV ray.

In the connecting step described above, by heat-pressing the connecting material interposed between the two elements to be connected together, the connecting material melts and is expelled from the interspace between the opposing electrodes aside to the free space where the electrodes are absent, until the opposing electrodes on the elements have been brought into contact with each other to thereby cause the opposing electrodes to be pressed together to build up an electroconductive frictional contact of them, while the connecting material is cured within the heat-pressed interspace to form the solid connection body. In case electroconductive particles are included, some of these particles will remain in between the opposing electrodes upon the heat pressing and are pressed there to build up a bridge of electroconductive frictional contact between these opposing electrodes. The portion of the resin mass expelled from the interspace between the opposing electrodes aside to the vacant space where the electrodes are absent will be cured there to build up a solid fixed bonding between the two elements. In this manner, an electroconductive contact between the opposing electrodes and a mechanical solid fixation of the two elements are effected simultaneously, whereby the electrical conductance and the mechanical bonding of the two elements are established securely, even when the contacting surface area of the opposing electrodes or terminals is small and the electrode interval is narrow. The electrical conductance between the two elements can be established between the opposing electrodes by the pressed frictional contact thereof, while electrical insulation between these electrodes with each other is securely maintained by holding them under isolation by the insulating resin of the connecting material, since each electroconductive particle is held isolated as a dispersion, whereby an anisotropically electroconductive connection between the two elements to be connected together is built up.

Ordinarily, the heat pressing is performed in the region to be bound, namely, in the area where the two elements to be connected together are laid together, by pressing the two elements onto each other with heating. The connecting material in the interspace within the binding region between the elements will be cured to build up a solid fixed layer, while the connecting material present in the extraneous portion on the other element will be subjected to a partial thermosetting reaction of the resin and the resin mass in this portion is present as a mixture of cured resin and uncured mass. According to the present invention, the connecting material in the extraneous portion is intentionally subjected to hardening up to a degree of hardening of at least 60%, preferably at least 70%.

The heating of the extraneous portion of the connecting material may be carried out either simultaneously with or after the heat pressing of the binding region. The specific way for heating the extraneous portion may consist of blowing a hot gas onto the extraneous portion from outside the element. By this, the extraneous portion can reliably be hardened in a simple way under control of the temperature. It is also possible to arrange a heating device beneath the element carrying the exposed extraneous portion of the connecting material for heating it via the element. By this, the hardening of the extraneous portion can be attained by a simple-designed device in a simple operation. The heating by this method can be performed at the same time with the heat pressing, though it may be performed after the heat pressing. The heating of the extraneous portion after the heat pressing may be realized by subjecting the resulting connection body totally to a heating treatment. By this, a uniformly cured connection body is obtained.

The degree of hardening can be expressed by the proportion of the curing-participant functional groups of the resin molecules in the connecting material before and after the hardening, which can be determined for each specific thermosetting resin. For an epoxy resin, the degree of hardening can be determined by detecting the content of the epoxy group before and after the hardening. When the degree of hardening of the thermosetting resin of the connecting material in the extraneous portion is higher than 60%, the saturation limit of moisture absorption of the connecting material is decreased to less than 3% by weight at a relative humidity of 85% and at a temperature of 85° C. and, when the degree of hardening is higher than 70%, the saturation limit of moisture absorption in the same condition is lower than 2.7% by weight.

By restricting the degree of hardening of the thermosetting resin in the connecting material to be 60% or higher, preferably 70% or higher, the moisture absorbability of the connecting material in the extraneous portion is rendered low, whereby the ionic contaminant will become difficult to be associated with the contained water molecules, so that the occurrence of galvanic corrosion of the electrode pattern in contact with the extraneous portion is avoided with the exclusion of the occurrence of defective electroconductance in the connection body. Therefore, an anisotropically electroconductive connection body with highly secured electroconductivity and mechanical fixation can be attained, even for elements having electrodes with a small width, small interval and narrow electrode pitch.

According to the present invention, an anisotropically electroconductive connection body with two elements connected under interposition therebetween of a connecting material containing a thermosetting resin can be obtained easily, which can avoid the occurrence of galvanic corrosion of the electrodes in the extraneous portion of the connecting material protruding from the periphery of one of the elements on the other one of the elements, whereby the occurrence of defective electroconductivity is prevented.

THE BEST MODE FOR EMBODYING THE INVENTION

Below, the present invention will further be described by way of embodiments with reference to the drawings appended.

In an embodiment illustrated in FIG. 1, the glass board 1 to be employed in an LCD is provided thereon with a plurality of ITO layers 2 serving as the electrodes. A semiconductor chip 3 of a driver IC has a corresponding number of bumps 4 serving as the counter electrodes. The ITO layers 2 and the bumps 4 serving as the electrodes are laid down to each be disposed in a correspondingly confronting relationship to each other under interposition of the connecting material 5 formed as a film therebetween, as shown in FIG. 1(a). The connecting material 5 is composed of a resin mass 6 constituted mainly of a thermosetting resin and electroconductive particles 7. If a connecting material in a form of paste is employed, it is coated on the substrate glass board 1. The connecting material 5 present on the glass board 1 in the portion outside the extent u of the semiconductor chip 3 forms an extraneous portion 9 in which the connecting lines for the electrodes 2 and 4 are laid down passing therethrough.

For a practical assemblage, the connecting material 5 is preliminarily placed on the glass board 1 over the ITO layers 2 so as to cover a region v which is greater than the extent u of the semiconductor chip 3, as shown in FIG. 1(a), whereon the semiconductor chip 3 is placed in such a manner that the connecting material layer 5 is interposed between them and each of the bumps 4 on the semiconductor chip 3 confronts the corresponding ITO layer 2. The resulting assemblage is then processed by heat-pressing the glass board 1 and the semiconductor chip 3 from outside in the directions indicated by the arrows x and y, while heating the connecting material 5. The specific manner of heat pressing will be described in detail afterwards. The resin mass 6 in the connecting material 5 within the region u is melted by the heat pressing and is expelled aside from the electrodes 2 and 4, whereupon the thermosetting resin in the resin mass 6 is hardened within the interspace 8 between the glass board 1 and the semiconductor chip 3. The resin mass 6 in the extraneous portion 9 of the connecting material 5 remains in an uncured state as such and, therefore, an additional heat processing of this portion is incorporated after the heat pressing by heating the connecting material 5 in this portion 9 at a temperature of 80° C. or higher for 8 hours or more, so as to reach a degree of hardening of the connecting material in this portion of 60% or higher, whereby a connection body 10 as shown in FIG. 1(b) is obtained.

In the connection body 10, electroconductive particles 7 remain between the ITO layer 2 and the bump 4 on the glass board 1 and are held under a pressed frictional contact with each other due to the hardening contraction of the resin mass 6 to build up an electroconductive connection between the ITO layer 2 and the bump 4. While the electroconductive connection is built up between the confronting electrodes, electrical continuity is put out between the neighboring connected electrodes due to the isolation of each connected electrode by the insulating resin mass surrounding it, since each electroconductive particle is held isolated in dispersion. In this manner, an anisotropically electroconductive connection body can be obtained. The electroconductive particles may be dispensed with when the contacting surface area between the electrodes 2 and 4 is small, so that direct contact of the electrodes with each other will be established.

Since the ITO layer 2 serving as the electrode for the glass board 1 extends over its extent u to the side of the LCD body, it has a portion passing through the extraneous portion 9 of the connecting material 5. If the resin mass 6 within the extraneous portion 9 remains in an uncured state, there may occur a danger of the ITO layer 2 being subjected to galvanic corrosion due to a possible association of the ionic contaminants in the resin mass 6 with the absorbed moisture in the resin mass 6. According to the present invention, such a danger of the occurrence of galvanic corrosion of the electrodes in the extraneous portion 9 of the connecting material 5 is securely avoided by the restriction of the degree of hardening of the connecting material in this portion 9 to a value of at least 60%, whereby the occurrence of defective electroconductivity by the galvanic corrosion is avoided.

Figure 2:
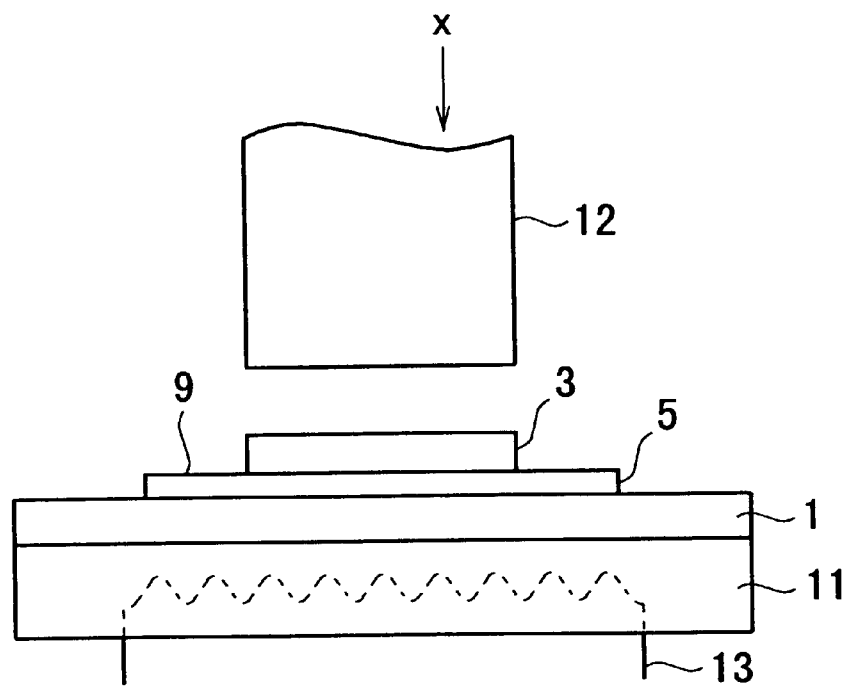
FIGS. 2(a) and 2(b) illustrate the manner of performing the method for forming the connection body of different embodiments according to the present invention, respectively, each in a schematic view.
Figure 2:
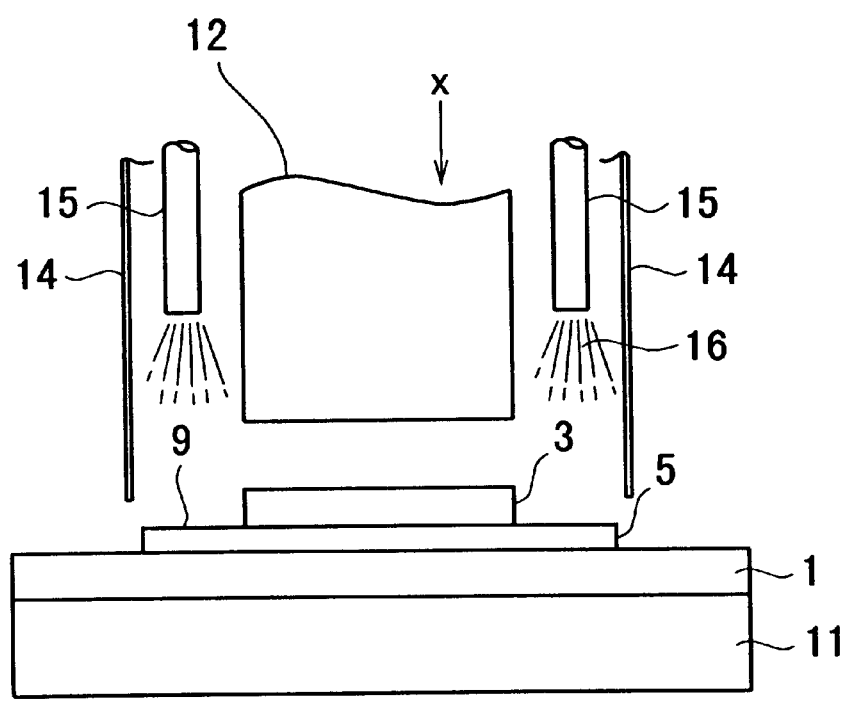

Further embodiments of the method for forming the connection body according to the present invention are illustrated in FIGS. 2(a) and 2(b), each in a schematic front view in which a support bed 11 and a heat-pressing head 12 are employed. The substrate glass board 1 is placed on the support bed 11 designed so as to have a configuration suitable for receiving the glass board 1 thereon. The support bed 11 shown in FIG. 2(a) is provided with a heating element 13. The heat-pressing head 12 is designed to have a configuration similar to that of the semiconductor chip. 3 and to be extendable in the direction x and is provided internally with a heating means (not shown).

In performing the method for forming the connection body using the arrangement shown in FIG. 2(a), the glass board 1 is placed on the support bed 11, whereon a layer of the connecting material 5 is placed in such a manner that it covers the region v greater than the extent u of the semiconductor chip 3. Then, the semiconductor chip 3 is mounted on the resulting assemblage, whereupon the heat-pressing head 12 is moved forward in the direction of x to effect pressing of the assemblage with heating. By this heat pressing, the connecting material 5 within the portion underneath the extent u of the semiconductor chip 3 will be hardened, while the connecting material 5 in the extraneous portion 9 remains uncured.

While such a heating by using a heating element provided on a support bed may in some cases be employed in a general heat pressing, such a heating is realized usually for the purpose of heating the material to be processed at temperatures around 40–50° C. uniformly and such a heating condition will not cause the connecting material in the extraneous portion 9 to harden. In such a case as above, it is necessary to incorporate an additional step for heat treatment of the connecting material in the extraneous portion 9, as mentioned above. If, however, the temperature attainable by the heating element 13 is settled at a temperature causing hardening of the connecting material, for example 120–200° C., for heating the connecting material 5 in the extraneous portion 9 via the glass board 1 to cause the hardening thereof, a degree of hardening of 60% or higher in this extraneous portion 9 may be attained. By employing this technique, an anisotropically electroconductive connection body can be obtained by a simple operation using a conventional apparatus.

In the embodiment illustrated in FIG. 2(b), the support bed 11 may or may not be provided with a heating element 13. The connecting material 5 in the extraneous portion 9 can be heated and hardened by blowing a hot gas 16 onto the extraneous portion 9 from a nozzle 15 in such a manner that a hood 14 is arranged surrounding the heat-pressing head 12 and the nozzle 15 and is forwarded simultaneously with the extending of the heat-pressing head 12 toward the extraneous portion 9, before the hot gas is jetted out from the nozzle 15. In this manner, a degree of hardening of the connecting material 5 in the extraneous portion 9 of at least 60% can be attained. By this, an anisotropically electroconductive connection body can be obtained while attaining securely the hardening of the resin mass in the extraneous portion 9 with easy temperature control.

EXAMPLES

Below, the present invention will be described in detail by way of Examples and Comparative Examples.

Example 1

Preparation of the Connecting Material

Two connecting material products A and B having a film form were prepared by blending an epoxy resin A (a high purity epoxy resin based on bisphenol A having an epoxy equivalent of 200) or B (an epoxy resin for general use based on bisphenol A having an epoxy equivalent of 200) as a thermosetting resin, together with a latent hardening agent based on imidazole as a hardening agent, a phenoxy resin as a thermoplastic resin and electrical conductor-coated electroconductive particles (particle size 5 μm) as electroconductive particles, in a composition as given in Table 1, and forming the resulting blend into a film having a thickness of 40 μm.

TABLE 1

| Blend | Product A | Product B |
|---|---|---|
| Adhesive component (wt. %) | | |
| Epoxy resin A | 30 | — |
| Epoxy resin B | — | 30 |
| Hardening agent | 40 | 40 |
| Phenoxy resin | 30 | 30 |
| Conduct. particle (vol. %)[1)] | 10 | 10 |
| Chloride ion conc. (ppm) | 40 | 120 |

Note:
[1)]volume %, based on the volume of the adhesive component.

Hardening Test

Figure 3:
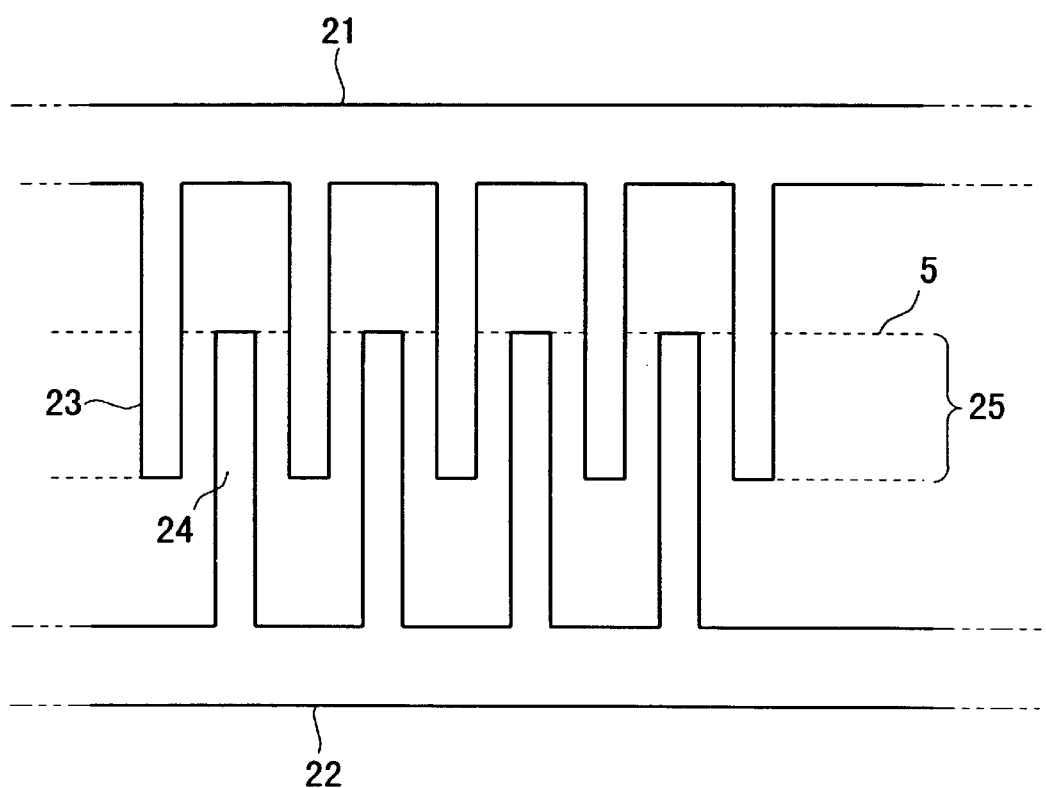
FIG. 3 shows the electrode pattern of the connection body of Example 1 in a plan view.

On a glass board, two electrodes 21 and 22 each made from an aluminum foil having a thickness of 400 nm in a comb-like pattern (with 150 teeth) were placed, as shown in FIG. 3, in such a manner that the teeth 23 of the comb of one electrode 21 are interposed in the interspaces of the comb teeth 24 of the other electrode 22, whereon either one of the connecting material film 5 (A or B) was laid along the lane 25 of the teeth-interlacing part of the electrodes, whereupon the resulting assemblage was heat-pressed so as to attain a different degree of hardening. Two samples each having a tooth width and a distance of the gap between the tooth of one electrode and the neighboring tooth of the counter electrode of both 25 μm (assemblage a) or both 50 μm (assemblage b) were prepared.

The width of the lane 25, and thus, the width of the connecting material 5 was 2 mm for both the samples. For these samples, the degree of hardening of the connecting material was determined from the proportion of remaining epoxy groups detected by a Fourier transform IR spectrophotometry. Using a sample hardened under the same conditions, the saturated moisture absorption at 85° C. and 85% relative humidity was detected by a moisture absorption-desorption apparatus (IGAsorp Moisture Sorption Analyser of the firm HIDEN).

Galvanic Corrosion Test

An electric voltage (12 volt) was impressed between the electrodes 21 and 22 and the assemblage was maintained under a condition of 85° C. and 85% relative humidity for 500 hours, while observing the state of occurrence of galvanic corrosion at the portion of the electrode (21, 22) contacting with the connecting material 5. The criterion of assessment of galvanic corrosion was as given below:

| Rank | Assessment |
|---|---|
| X | Broken electroconductive continuity |
| Δ | Galvanic corrosion up to more than ½ of the width of the electrode tooth without broken electroconductive continuity |
| ○ | A partial galvanic corrosion up to a degree not exceeding ½ of the width of the electrode tooth |
| ⊙ | No galvanic corrosion |

The results are recited in Table 2.

TABLE 2

| Degree of Harden. (%) | Moist. Absorp. (%) | Connecting material product | | |
|---|---|---|---|---|
| | | A | | B |
| | | Assemb. a | Assemb. b | Assemb. b |
| 0 | 3.0 | Δ | ⊙ | Δ |
| 10 | 3.1 | X | ○ | X |
| 30 | 3.2 | X | ○ | X |
| 50 | 3.5 | X | ○ | X |
| 70 | 2.7 | ⊙ | ⊙ | ○ |
| 90 | 2.1 | ⊙ | ⊙ | ○ |

Comparative Example 1

An IC chip as shown in FIG. 1 (made of silicon with of 2 mm×20 mm, a thickness of 0.55 mm; having 522 gold stud bumps of 20 μm thickness with a 80 μm pitch) was assembled on a substrate glass board (supplied from the firm Corning with a tradename of 1737F. having a size of 50 mm×10 mm×0.7 mm) with the above connecting material film A provided therebetween. The substrate board was obtained by arranging on a glass board of a thickness of 0.7 mm a number of ITO strips corresponding to those of the stud bumps of the IC chip in a corresponding geometrical relationship with that of the stud bumps. The IC chip was placed on the substrate glass board in such a manner that each of the bumps confronted each corresponding ITO strip with the interposition of the connecting material film in between the substrate glass board and the IC chip, as shown in FIG. 1(a). The resulting assemblage was then subjected to heat pressing under a condition of 200° C.×10 sec. ×400 kgf pressing force to build up an anisotropically electroconductive connection body, as shown in FIG. 1(b). The formation of the connection body was performed without applying any heating by the heating element 13 of the apparatus shown in FIG. 2(a).

For the resulting connection body, the degree of hardening was detected at various portions after the heat pressing. On the other hand, an electric voltage (12 volt) was impressed between the ITO strip and the stud bump to carry out a galvanic corrosion test under the condition of 85° C. and 85% humidity for 500 hours. The results are recited in Table 3.

Example 2

The procedures of Comparative Example 2 were followed, except that the heat pressing was performed while heating the support bed 11 using the heating element 13 of the apparatus as shown in FIG. 2(a) so as to maintain a temperature of 150° C. The galvanic corrosion test was carried out as in Comparative Example 1 and the results were assessed in the same manner as in Example 1. The results are recited in Table 3.

TABLE 3

| | Comp. Example 1 | | Example 2 | |
|---|---|---|---|---|
| Portion examined | % degree of hard. | Galva. corro. | % degree of hard. | Galva. corro. |
| In the region of u | 85 | ⊙ | 93 | ⊙ |
| At boundary of u | 85 | ○ | 91 | ⊙ |
| 1 mm out from u | 70 | ○ | 89 | ⊙ |
| 2 mm out from u | 30 | X | 80 | ⊙ |
| 3 mm out from u | 5–10 | X | 75 | ⊙ |

From the results given above, it is seen that the occurrence of galvanic corrosion is suppressed by restricting the degree of hardening of the connecting material in the extraneous portion protruding from the periphery of one of the elements to be connected together to a value of at least 60% to thereby reduce the moisture absorbability thereof.

What is claimed is:

1. An anisotropically electroconductive connection body comprising:
   two elements connected with each other, each of the two elements having electrodes on a confronting face thereof; and
   a connecting material containing an adhesive component comprising a thermosetting resin interposed between the two elements, the connecting material having an extraneous portion protruding from a periphery of one of the elements on the other of the elements,
   wherein the degree of hardening of the thermosetting resin in the extraneous portion is at least 60% and the saturation limit of moisture absorption of the extraneous portion at 85° C. and at a relative humidity of 85% is no greater than 3%.

2. The anisotropically electroconductive body of claim 1, wherein said connecting material contains a latent hardening agent.

3. The anisotropically electroconductive body of claim 2, wherein the latent hardening agent is at least one of an imidazole and an amine, encapsulated in microcapsules.

4. The anisotropically electroconductive body of claim 2, wherein the degree of hardening of the thermosetting resin in the extraneous portion is from 60–90%.

5. The anisotropically electroconductive body of claim 4, wherein the degree of hardening of the thermosetting resin in the extraneous portion is 90%.

6. A method for forming an anisotropically electroconductive connection body comprising the steps of:
   providing two elements to be connected with each other, each of the two elements having electrodes on a confronting face thereof;
   interposing a connecting material containing an adhesive component comprising a thermosetting resin between the two elements while positioning the two elements so that the confronting faces face each other, the connecting material having an extraneous portion protruding from a periphery of one of the elements on the other of the elements;
   heat-pressing the two elements to harden the thermosetting resin; and
   heating the extraneous portion of the connecting material either simultaneously with or after the heat-pressing of the two elements to effect hardening of the thermosetting resin to a degree of hardening of at least 60% and the saturation limit of moisture absorption of the extraneous portion at 85° C. and a relative humidity of 85% is no greater than 3%.

7. The method as claimed in claim 6, wherein the heating of the extraneous portion is effected by blowing a hot gas onto the extraneous portion.

8. The method as claimed in claim 6, wherein the heating of the extraneous portion is effected by heating the other one of the elements.

9. The method as claimed in claim 6, wherein the hardening of the thermosetting resin in the extraneous portion is effected by heating the connection body after the heat-pressing.

10. The method as claimed in claim 6, wherein the hardening of the thermosetting resin is effected using a latent hardening agent.

11. The method as claimed in claim 10, wherein the latent hardening agent is at least one of an imidazole and an amine, encapsulated in microcapsules.

12. The method as claimed in claim 6, wherein the degree of hardening of the thermosetting resin in the extraneous portion is from 60–90%.

13. The method as claimed in claim 12, wherein the degree of hardening of the thermosetting resin in the extraneous portion is 90%.

* * * * *